United States Patent
Stahl et al.

(10) Patent No.: US 9,835,666 B2
(45) Date of Patent: Dec. 5, 2017

(54) NOISE DETECTION CIRCUIT

(71) Applicant: NXP B.V., Eindhoven (NL)

(72) Inventors: Juergen Stahl, Herrieden (DE); Thomas Duerbaum, Baiersdorf (DE); Alexander Pawellek, Hamburg (DE); Jens Goettle, Erlangen (DE); Hans Halberstadt, Groesbeek (NL); Anton Blom, Wijchen (NL); Frans Pansier, Nuenen (NL)

(73) Assignee: NXP B.V., Eindhoven (NL)

( * ) Notice: Subject to any disclaimer, the term of this patent is extended or adjusted under 35 U.S.C. 154(b) by 108 days.

(21) Appl. No.: 14/809,008

(22) Filed: Jul. 24, 2015

(65) Prior Publication Data

US 2016/0061871 A1   Mar. 3, 2016

(30) Foreign Application Priority Data

Aug. 27, 2014 (EP) ..................................... 14182545

(51) Int. Cl.
*G01R 29/26* (2006.01)
*G01R 31/42* (2006.01)

(52) U.S. Cl.
CPC ............. *G01R 29/26* (2013.01); *G01R 31/42* (2013.01)

(58) Field of Classification Search
CPC ............. G01R 19/0092; G01R 31/026; G01R 31/2834; G01R 31/42; G01R 31/343
USPC ................ 324/600, 611–623, 674–683, 500, 324/523–533
See application file for complete search history.

(56) References Cited

U.S. PATENT DOCUMENTS

| 2014/0062439 A1* | 3/2014 | Nishijima | H02M 1/143 323/282 |
| 2014/0085947 A1* | 3/2014 | Capilla | H02M 1/4225 363/52 |
| 2014/0218048 A1 | 8/2014 | Stahl et al. | |
| 2015/0212133 A1 | 1/2015 | Stahl et al. | |

FOREIGN PATENT DOCUMENTS

| EP | 2 538 231 A1 | 12/2012 |
| WO | 03/014749 A1 | 2/2003 |

OTHER PUBLICATIONS

Schroth, S. et al. "Analysis and Practical Relevance of CM/DM EMI Noise Separator Characteristics", 2014 16th European Conf. on Power Electronics and Applications, 10 pgs. (Aug. 2014).
Extended European Search Report for EP Patent Appln. No. 14182545.5 (dated Mar. 5, 2015).

* cited by examiner

*Primary Examiner* — Melissa Koval
*Assistant Examiner* — Trung Nguyen

(57) ABSTRACT

A noise detection circuit 100 for a power supply, the noise detection circuit 100 comprising: an impedance element 110 connected to a line 104 for carrying a power supply current having a noise signal component, the noise signal comprising a common mode noise signal and a differential mode noise signal; a filter element 112 coupled to the impedance element 110 and configured to suppress the differential mode noise signal in the noise detection circuit 110; and an evaluation circuit 140 coupled to the impedance element 110 or the filter element 112 and arranged to sense the common mode noise signal and provide an output representative of the common mode noise signal.

17 Claims, 6 Drawing Sheets

NOISE DETECTION CIRCUIT

CROSS-REFERENCE TO RELATED APPLICATIONS

This application claims the priority under 35 U.S.C. §119 of European patent application no. 14182545.5, filed on Aug. 27, 2014, the contents of which are incorporated by reference herein.

FIELD

The present disclosure relates to a noise detection circuit. In particular, but not exclusively, the disclosure relates to a common mode noise detection circuit.

BACKGROUND

The increasing noise susceptibility of many digital circuits and the requirement to comply with international standards mean that electromagnetic compatibility is an increasingly important issue. One way of improving electromagnetic compatibility is to reduce the level of electromagnetic interference (EMI) noise present on the power lines by filtering the noise.

In a power supply with two or more power lines, the EMI noise can include common mode (CM) noise and differential mode (DM) noise. The CM noise and DM noise are defined relative to protective earth, although a protective earth connection may not be present in the system. CM noise is a potential or current that is present in both lines, with no phase shift between the two lines. DM noise is a potential or current that is present in both lines, with a phase difference of 180° between the two lines.

It is known to filter CM noise and DM noise with passive filters. These are cheap and robust, but take up a lot of space on a printed circuit board compared to other components. Passive filters also reduce the efficiency of the whole system due to their energy consumption.

Active filters are envisaged that take up less space and might be more efficient. For an active filter to work, noise detection circuits (also referred to as sensors) measure the level of CM noise and DM noise, and then process the signal to cancel out or mitigate the detected noise signals. CM noise and DM noise require different cancellation and mitigation techniques, and so it is necessary to measure the separate CM noise signal and DM noise signal.

Existing CM noise detection circuits or sensors either make use of a connection to protective earth or use a transformer. Not all devices in which a CM noise detection circuits or sensors may be implemented have a protective earth connection available and transformer based CM noise sensors might be bulky and/or expensive.

At least one object of the invention is to provide a CM noise detection circuit for use with an active CM noise filter.

SUMMARY

According to a first aspect, there is provided a noise detection circuit for a power supply. The noise detection circuit may comprise an impedance element connected to a line for carrying a power supply current having a noise signal component, the noise signal comprising a common mode noise signal and a differential mode noise signal. The noise detection circuit may also comprise a filter element, coupled to the impedance element and configured to suppress the differential mode noise signal in the noise detection circuit. The noise detection circuit may further comprise an evaluation circuit coupled to the impedance element or the filter element and arranged to sense the common mode noise signal and provide an output representative of the common mode noise signal.

The noise detection circuit makes use of the different frequency characteristics of CM noise and DM noise and can thus be implemented without a reference to protective earth. Also, the detection circuit uses commonplace components and is thus easy to implement. The noise detection circuit also makes use of components found in system parts such as passive DM noise filters and so can be easily integrated in a way that saves further space on a printed circuit board since components can be used in both devices.

The evaluation circuit may sense the common mode noise signal with respect to a reference, the reference being any suitable reference other than protective earth. Optionally, the common mode noise signal may be sensed with reference to positive, negative, circuit ground, live wire, neutral wire, or any other point in the power supply excluding protective earth.

The evaluation circuit may be configured to sense the voltage across the filter element.

Optionally, the impedance element may be a resistor and the evaluation element may be a separate evaluation circuit coupled to the filter element, the signal representative of the common mode noise signal being provided by measurement of the voltage across the filter element.

Alternatively, the impedance element and/or evaluation circuit may be comprised in an integrated circuit and the common mode noise signal may be detected and processed by the integrated circuit. The integrated circuit may comprise a current input or voltage input, and may provide information on the common mode noise signal either internally or at an output.

The filter element may be arranged to only allow frequencies above a threshold to pass, such that the common mode noise signal is only measured at frequencies above the threshold.

The filter element may comprise one or more of: a high-pass filter coupled to the sensing element; a band-pass filter coupled to the sensing element; an inductance arranged as a filter; and a digital filter realised by an integrated circuit.

The filter element and the sensing element may be provided in a single integrated circuit.

The noise detection circuit may comprise: an alternating current power supply; and a converter to convert the alternating current to a direct current.

The power supply may comprise a first power line extending between a first input terminal and a first output terminal, and a second power line extending between a second input terminal and a second output terminal.

The noise detection circuit may further comprise: a capacitive element connectable between the first and second power lines of the power supply to form a capacitive conduction path therebetween; and an asymmetry element connected to the capacitive conduction path and configured to cause a common mode noise signal in the power lines to pass through the capacitive conduction path.

The asymmetry element may cause the common mode noise signal to be substantially evenly distributed between the first power line and the second power line either before or after the capacitive conductive path, and asymmetrically distributed the other side of the capacitive conductive path, wherein the common mode noise signal redistributes via the capacitive conductive path, causing the conversion of the common mode noise signal to the quasi-differential mode noise signal.

When the common mode noise signal is asymmetrically distributed between the first power supply line and the second power supply line, substantially all of the common mode noise signal may be transmitted in one of the first and second power supply lines.

The power lines may be connected to a switching power supply, the switching power supply switching at a switching frequency, the threshold frequency for detection depending on the application. It can be found using state of the art measurement set-ups. See, for example "Characterization of a Modified LISN for Effective Separated Measurements of Common Mode and Differential Mode EMI Noise" in 2010 IEEE Energy Conversion Congress and Exposition (ECCE).

The impedance element may be a parasitic resistor of the capacitive element.

The asymmetry element may comprise an inductor arranged on either the first power supply line or the second power supply line.

Where the noise detection circuit comprises an alternating current power supply, the converter may comprise at least a portion of the asymmetry element. Optionally, the converter may comprise a bridge rectifier.

The impedance element may be connected in series with the capacitive element, such that the line for carrying a noise signal is provided by the capacitive conduction path.

Alternatively, whether or not the capacitive element is provided, the impedance element may be connectable in series between the first input terminal and the first output terminal or between the second input terminal and the second output terminal, the first or second power line providing the line carrying a noise signal.

Optionally, if an asymmetry element is provided and the impedance element is connected between the first input terminal and the first output terminal, the asymmetry element is connected in series between the second input terminal and the second output terminal. Further optionally, if an asymmetry element is provided and the impedance element is connected between the second input terminal and the second output terminal, the asymmetry element is connected in series between the first input terminal and the first output terminal.

The common mode noise signal may be evaluated in the frequency domain.

The common mode noise signal may be evaluated in the time domain.

The noise detection circuit may comprise a passive differential mode noise filter.

The impedance element may be provided between the first and second power inputs and the passive differential mode noise filter.

When the noise detection circuit includes the capacitive conduction path and asymmetry element, the passive differential mode noise filter may comprise the capacitive element and/or at least a portion of the asymmetry element.

The passive differential mode noise filter may comprise an inductor either arranged on the first power line or the second power line and the capacitive element. The inductor may be comprised in the asymmetry element.

The capacitive conduction path may be provided between the inductor and the first and second input terminals.

The passive differential mode noise filter may further comprise a second capacitive element, provided between the first power line and the second power line, the capacitive element and the second capacitive element being provided either side of the inductor.

Where the noise detection circuit is provided with an alternating current power supply, the passive differential mode noise filter may comprise a third capacitive element arranged between a first input power line of the power supply and a second input power line of the power supply.

According to a second aspect, there is provided a passive DM noise filter comprising a noise detection circuit according to the first aspect.

The integration of a passive DM filter and a noise detection circuit, which forms part of an active CM noise filter, is advantageous because it provides the benefits of improved efficiency, reduced space and easier integration by enabling use of an active CM noise detection circuit and further enables easier integration using a relatively simple DM filter structure.

According to a third aspect of the invention, there is provided a noise filter for a power supply comprising the noise detection circuit of the first aspect or the passive DM filter of the second aspect and an active common mode noise filter module connected to receive the output signal from the evaluation element and configured to suppress the common mode noise signal in the power lines based on the output signal.

BRIEF DESCRIPTION OF DRAWINGS

The invention is described in further detail in the following by way of exemplary embodiments and with reference to the accompanying drawings, in which.

DETAILED DESCRIPTION

Figure 1:
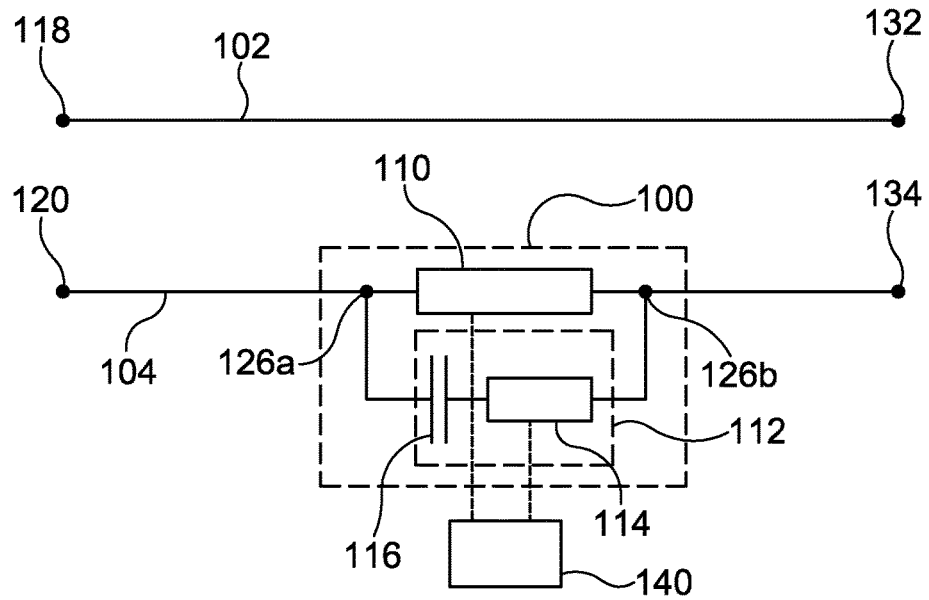
FIG. 1 is a schematic drawing of a first embodiment of a CM noise detection circuit.

FIGS. 1 to 3 and 5 to 8 show examples of noise detector circuits 100 that can be used to detect a CM noise signal passing through the power lines 102, 104 of a power supply. The lines 102, 104 are considered to have zero, or negligible impedance.

In general, the power supply includes a first power line 102 extending between a first input 118 and a first output 132 and a second power line extending between a second input 120 and a second output 134.

Power is transmitted along the power lines 102, 104 and is provided at the output terminals 132, 134, and both CM noise and DM noise will pass through the power lines 102, 104. The power supply current provided at the output terminals 132, 134 can be provided to an electrical load (not shown). There may be elements of the power supply, for example additional filters, dividers etc. . . . before the load.

The frequency spectrum of CM noise shows different behaviour to the frequency spectrum of DM noise. DM noise generally shows a continuous decaying level with increasing frequency, whereas CM noise has a generally flat spectrum. Therefore, by blocking low frequency signals, the DM noise can be suppressed and the CM noise measured. The frequency of both CM noise and DM noise is several orders of magnitude higher than any power supply current passing through the power lines 102, 104. Therefore, the power supply current does not impact the detection of CM noise.

The noise detection circuit 100 comprises an impedance element 110 and a filter element 112. The impedance element 110 is used as a sensor to detect the CM noise signal, whilst the filter element 112 suppresses the DM noise signal passing through the impedance element 110. In some applications suppression of the DM noise of only 20 dB can be sufficient.

FIG. 1 illustrates a first example embodiment of a noise detector circuit 100. As discussed above, CM noise and DM noise are both conducted in the first 102 and second 104 lines. The CM noise has the same phase in both lines 102, 104, but the DM has different phase in each line 102, 104. Therefore, the noise in the first line 102 is given by $U_{cm}+U_{DM}$ and the noise in the second line 104 is given by $U_{cm}-U_{DM}$. Similarly, the noise current in the first line 102 is $i_{cm}+i_{DM}$ and the noise current in the second line is $i_{CM}-i_{DM}$.

The noise detector circuit 100 of FIG. 1 includes a resistor 110 (the impedance element) connected in series on the second power line 104, between the second input 120 and the second output 134. A high-pass filter 112 is connected across the sensing resistor 110 to filter the DM noise signal.

The high-pass filter 112 comprises a filter resistor 114 and a filter capacitor 116 connected in series. A first plate of the filter capacitor 116 couples to the second power line 104 at a first filter branch point 126a, provided between the second input 120 and a first terminal of the sensing resistor 110. A second plate of the filter capacitor 116 couples to the first terminal of the filter resistor 114. The second terminal of the filter resistor 114 couples to the second power line 104 at a second filter branch point 126b, provided between the second terminal of the sensing resistor 110 and the second output 134.

The noise current develops a voltage across the sensing resistor 110 and the filter resistor 114. The filter 112 means that only the high frequency current develops a voltage across the filter resistor 114. Therefore, the voltage across the filter resistor 114 is indicative of the CM noise signal.

In the current embodiment, an evaluation circuit 140 is coupled to the sensing resistor 110 or the filter resistor 114 and the voltage developed across the sensing resistor 110 is detected by the evaluation circuit 140 as the voltage across (or current passing through) the sensing resistor 110 or the voltage across (or current through) the filter resistor 114.

In some embodiments, the voltage across the impedance element 110 may also be measured and processed along with the voltage across the filter resistor 114, to determine the CM noise signal.

The evaluation circuit 140 evaluates the voltage with respect to any suitable reference potential. For example, the positive or negative of a power supply, a live wire, a neutral wire, or a circuit ground could be used. It is not necessary to use protective earth as a reference.

The evaluation circuit 140 provides an output that is representative for the CM noise level. The output signal may be in the form of a current or voltage signal. Alternatively, the information may contain data to enable an active filter to reconstruct the CM noise signal, for removal from the power supply current.

Figure 2:
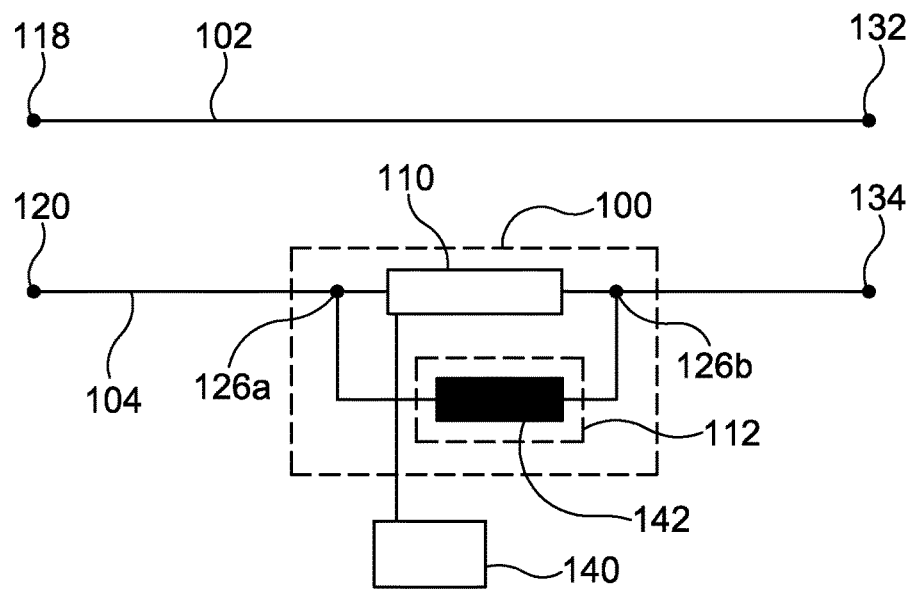
FIG. 2 is a schematic drawing of a second embodiment of a CM noise detection circuit.

FIG. 2 shows another example of a noise detector circuit 100. The example shown in FIG. 2 is similar to the example shown in FIG. 1 and where the same components are used, the same reference numerals are used.

In FIG. 2, the high-pass filter 112 is replaced with an inductor 142. Therefore, the noise detection circuit 100 comprises a resistor (the sensing resistor) 110 in parallel with an inductor 142.

As a result of the inductor 142, the impedance of the noise detection circuit 100 increase with frequency. Low frequency signals pass through the inductor 142, whilst high frequency signals pass though the sensing resistor 110. The evaluation circuit 140 is coupled to the sensing resistor 110 and thus the CM noise signal can be detected as the voltage across (or current through) the sensing resistor 110.

Figure 3:
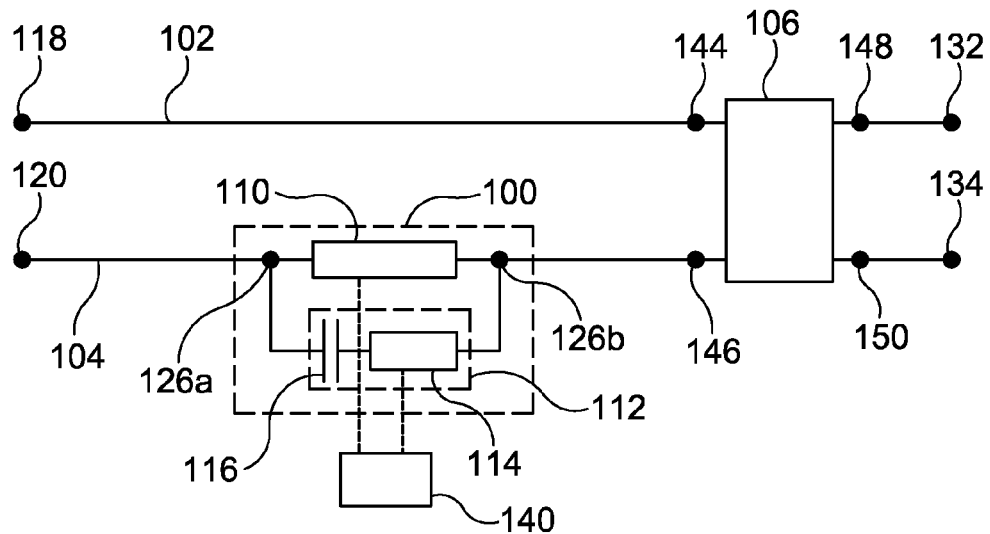
FIG. 3 is a schematic drawing of the CM noise detection circuit of FIG. 1 integrated with a passive DM noise sensor.

FIG. 3 shows the noise detection circuit 100 of FIG. 1 operating in conjunction with a passive DM noise filter 106. The first power line 102 runs between the first input terminal 118 and a first passive filter input terminal 144. The first power line 102 then continues from a first passive filter output terminal 148 to the first output terminal 132.

The passive DM noise filter 106 is connected to the second power line 104 through a second passive filter input terminal 146. The CM noise detection circuit 100 is provided on the second line between the second input terminal 120 and the second passive filter input terminal 146. The second power line 104 continues from a second passive filter output terminal 150 to the second output terminal 134.

The passive DM noise filter 106 operating in conjunction improves the detection of CM noise, since it will work in conjunction with the filtering element 112 included in the detection circuit to improve the suppression of DM noise.

Passive filters for DM noise are simpler to implement than passive filters for CM noise. Therefore, where systems with active CM and DM filters are not possible, it is simpler to integrate an active CM filter with a passive DM filter than a passive CM filter with an active DM filter.

It will be appreciated that although FIG. 3 shows a passive DM noise filter 106 in combination with the CM noise detection circuit 100 of FIG. 1, the CM noise detection circuit of FIG. 2 may also be used.

It will also be appreciated that, although FIGS. 1 to 3 all show the CM noise detection circuit 100 provided on the second power line 104, it may be the case that the noise detection circuit 100 is provided on the first power line 102, and the second power line 104 directly connects the second input 120 with the second output 134 or the second passive filter input 146.

Although the examples shown in FIGS. 1 to 3 provide for simpler detection of the CM noise signal than existing CM noise sensors, there is always an impedance element 110 in series with one of the power supply lines 102, 104. It is not always preferred to have this, for these components are relatively bulky and expensive, consume board space and exhibit significant losses.

Therefore, in some embodiments, the noise detection circuit 100 uses a branch between the power lines 102, 104, such that there are no unnecessary impedance components provided on the power supply lines 102, 104. This noise detector 100 makes use of asymmetry in the power lines 102, 104 to force the CM noise signal through the branch. Asymmetry will be explained with reference to FIGS. 4A and 4B.

Figure 4A:
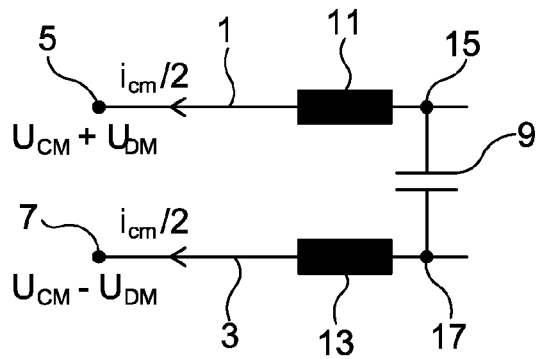
FIG. 4A is a general model of two symmetric power lines.
Figure 4B:
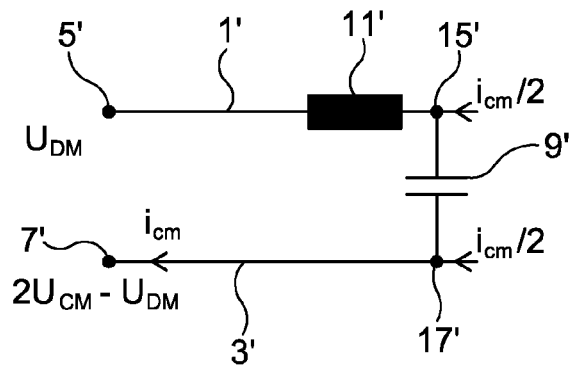
FIG. 4B is a general model of two asymmetric power lines.

FIGS. 4A and 4B both illustrate a first power line 1 and a second power line 3, parallel to the first power line 1. A branch is provided between a branch point 15 on the first power line 1 and a branch point 17 on the second power line 3, and a capacitor 9 is provided on the branch.

In FIG. 4A, a first power line inductor 11 is provided on the first power line 1 and a second power line inductor 13 is provide on the second power line 3. The inductors 11, 13 have the same inductance.

In power lines with equal inductors, the noise signal voltage on the first power line 1, at the connection to the power supply, is $u_1=u_{cm}+u_{DM}$ and the noise voltage signal on the second power line 3, at the same point, is $u_2=u_{CM}-u_{DM}$ (where $u_{cm}$ is the CM noise voltage and $u_{DM}$ is the DM noise voltage) and the CM noise current ($i_{cm}$) is split equally between both lines. The power lines 1, 3 in FIG. 4A are considered to be symmetric, since the CM noise signal is always evenly split between the lines.

In FIG. 4B, the second power line inductor 13 is omitted but the first power line inductor 11' is retained. Between the power terminals 5', 7' and the capacitor 9' branch (first stage), the CM noise current ($i_{CM}$) flows through the second power line 3' only. The other side of the capacitor 9' branch (second stage), the noise signal is equally distributed between the first power line 1' and the second power line 3'. The noise current flows through the capacitor branch to enable this redistribution. The power lines 1', 3' in FIG. 4B are considered to be asymmetric, due to the variation in the CM noise signal.

Causing the CM current to be transmitted predominantly in one of the power lines 1', 3' in a first stage and to be redistributed in a second stage can be considered as converting the noise signal from a pure CM signal to a DM type signal. The converted CM noise signal is not a true DM signal, since the signal in the first power line 1' does not oppose the signal in the second power line 3', and so may be referred to as a quasi-DM signal. Therefore, the asymmetry in the power lines 1', 3' is such that the common mode noise is converted to quasi-differential mode noise in the capacitor 9' branch.

The conversion, or asymmetry, can be used to determine the CM noise signal voltage ($u_{CM}$) or current ($i_{CM}$). The noise voltage on the first power line 1', at the connection to the power supply, is $u_1=u_{DM}$. A voltage of $-u_L$ is dropped across the first power line inductor 11', and so the voltage on the first power line 1' at the branch point 15' where the capacitor 9' connects to the first power line 1' is $u_2=u_{DM}-u_L$. The noise signal voltage on the second power line 3', at the connection to the power supply, where the capacitor 9' connects to the second power line 3', is $u_3=2u_{CM}-u_{DM}$. The voltage at the second branch point 17' is also $u_3$.

The voltage drop across the capacitor 9' is thus given by:

$$u_{23}=u_2-u_3=2u_{dm}-2u_{cm}-u_L \quad (1)$$

The voltage drop between the input to the inductor 11' on the first power line 1' and the branch point 17' where the capacitor 9' connects to the second power line 3' is given by:

$$u_{13}=u_1-u_3=2u_{dm}-2u_{cm} \quad (2)$$

The DM noise signal typically drops at higher frequencies. Therefore, in the appropriate frequency range, $u_{13}$ can be approximated to:

$$u_{13}\approx-2u_{cm|high\ frequency} \quad (3)$$

Therefore, in the arrangement in FIG. 4B, $u_{13}$ can be measured as the voltage between the two lines 1', 3', at sufficiently high frequencies and the CM noise signal can be extracted from this measurement.

In the above example, the CM noise signal current flows predominantly in one power line 1', 3' in the first stage and is equally distributed between the power lines 1', 3' in the second stage. If the CM noise signal current is equally distributed in the first stage and flows predominantly in one of the lines 1', 3' in the second stage, the voltages are still calculated in the same way. In this situation, the CM noise signal can be directly measured as the voltage across or current through the capacitor 9'.

More generally, the CM noise is changed from one distribution between the power lines to another distribution. In one example of higher order DM noise filters, a redistribution from 0%/100% to 100%/0% can be reached by placing the DM chokes alternatingly in the upper and lower line. Other redistributions are possible.

In both cases, the CM current is forced through the capacitor 9', allowing for detecting of the CM noise signal. Forcing the CM current through the capacitor 9' can be realised by any suitable asymmetric arrangement.

The sensing of the CM noise signal in a power line using the conversion means that it is not necessary to use a protective earth connection to determine the CM noise signal. Instead, any suitable available reference can be used as the second line. For example, the positive or negative of a power supply, a live wire, a neutral wire, or a circuit ground could be used.

Figure 5:
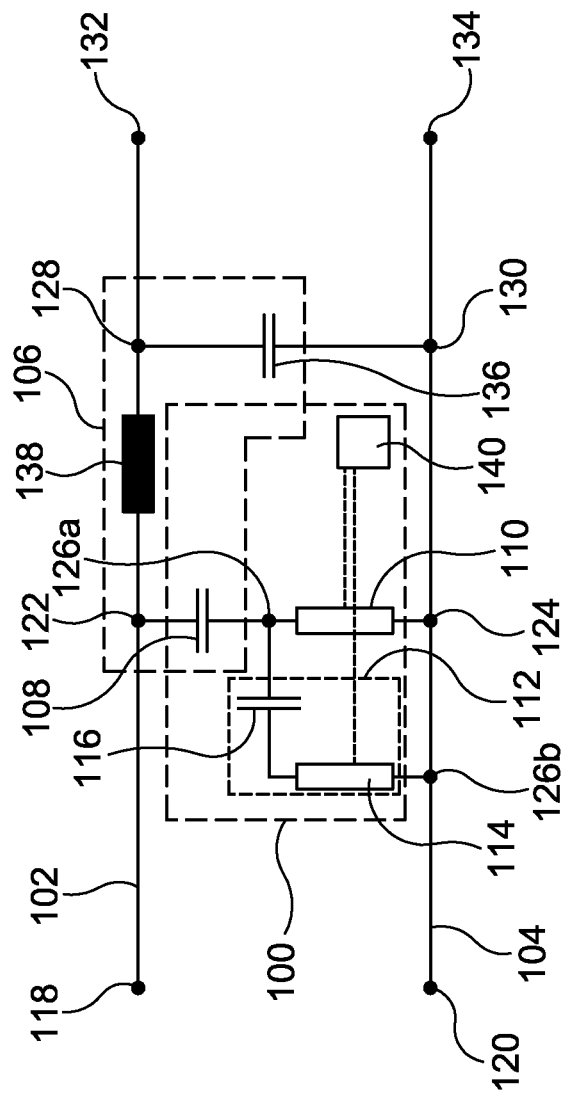
FIG. 5 is a schematic drawing of a CM noise detection circuit utilising asymmetric power lines.

FIG. 5 illustrates one example of a CM noise detection circuit 100 that utilises asymmetry and the conversion of CM noise to detect the CM noise signal. The CM noise detection circuit 100 comprises a capacitor 108 connected between the first power line 102 and the second power line 104. In this example, the asymmetry is provided by an inductor 138 provided on the first power supply line 102 after the capacitor 108 branch.

The capacitor 108 corresponds to the capacitor 9' in FIG. 4B and the inductor 138 corresponds to the first power line inductor 11' in FIG. 4B. The sensing resistor 110 is used to detect the CM noise signal when it passes through the capacitive branch, as it is converted.

A filter element 112 is provided as part of the detection circuit 100. The filter element 112 suppresses the DM noise signal from the power lines 102, 104, as it passes through the capacitive branch. This means the signal is measured over the appropriate frequency range as a voltage across filter resistor 114 (see equation 3).

As with the examples shown in FIGS. 1 to 3, in the example shown in FIG. 5, the impedance element is a simple resistor 110 and the filter element is a first order high-pass filter 112. In a more sophisticated set-up a higher order filter is possible as well. As will be discussed in more detail below, in some embodiments, the filter arrangement may be such that the DM noise signal in the impedance element 110 is sufficiently suppressed that the CM noise signal can be measures as the voltage across (or current through) the sensing resistor 110.

The capacitor 108 and the sensing resistor 110 are connected in series with each other on the branch extending between the first power line 102 and the second power line 104. A first plate of the capacitor 108 is connected to the first power line 102 at a first branch point 122 on the first power line 102. The first branch point 122 is located between the first power input terminal 118 and the inductor 138.

The opposing plate of the capacitor 108 is connected to a first terminal of the sensing resistor 110. The second terminal of the sensing resistor 110 is connected to a second branch point 124 on the second power line 104. The second branch point 124 is located between the second power input terminal 120 and the second power output terminal 134.

As with the embodiment discussed in FIGS. 1 and 3, the high-pass filter 112 incorporated in the current embodiment comprises a resistor 114 and a capacitor 116 connected in series. In the current embodiment, the first filter branch point 126a is located on the capacitive conduction path, between the sensing resistor 110 and the capacitor 108 and the second filter branch point 126b is located on the second power line 104, between the second input 120 and the branch point 124 for the capacitive conduction branch.

In the current embodiment, the CM noise detection circuit 100 functions based on the principle discussed in relation to FIG. 4B, such that the CM noise signal can be detected as it passes through the capacitor 108 between the first 102 and second 104 power lines. As with the embodiment discussed in relation to FIG. 1, the CM noise signal passing through the sensing resistor 110 develops a voltage.

The evaluation circuit 140 in the current embodiment functions in the same way as the evaluation circuit of FIG. 1. The voltage developed across the sensing resistor 110 can be sensed by measuring the voltage across (or current through) the sensing resistor 110 or filter resistor 114. The evaluation circuit 140 then evaluates the voltage, with respect to a reference and provides the output. The same reference as discussed in relation to FIG. 1 may be used.

In the current embodiment, the high-pass filter 112 only filters the DM noise signal from the capacitive branch. It does not affect the DM noise signal in the first and second 102, 104 power supply lines. The noise detection circuit 100 of the current embodiment could therefore be integrated with a passive DM noise filter in a similar manner to FIG. 3.

However, the structures shown in FIG. 4A and FIG. 4B are also capable of functioning as a passive DM noise filter. Therefore, alternatively, the detection circuit 100 in FIG. 5 can be integrated with a passive DM noise filter 106 by sharing at least some of the components. In the example shown in FIG. 5, the capacitor 108 on the branch between the first line 102 and the second line, and the inductor 138 form part of the CM noise detection circuit 100 and part of the passive DM noise filter 106.

In addition to the capacitor 108 and the inductor 138, the passive DM noise filter 106 optionally includes a second capacitor 136.

A first plate of the second capacitor 136 is connected to a third branch point 128. The third branch point 128 is located on the first power line 102 between the inductor 138 and the first output terminal 132. A second plate of the second capacitor 136 is connected to a fourth branch point 130. The fourth branch point is located on the second power line 104, between the second branch point 124 and the second output terminal 134.

With the second capacitor 136 in place, the passive DM filter 106 forms a "CLC" or "Pi" filter, as is known in the art. The same principle can also be applied to higher order DM noise filters.

Asymmetry can also be used when the impedance element 100 is provided in series on one of the power lines 102, 104. The capacitor 108 is provided in the branch between the first power line 102 and the second power line 104, to provide the conversion of CM noise. In a similar manner to FIG. 5, a noise detection circuit 100 provided in series on a power line 102, 104, with asymmetrical power lines can be integrated with an asymmetric DM noise filter 106, the filter also providing the asymmetry.

Figure 6:
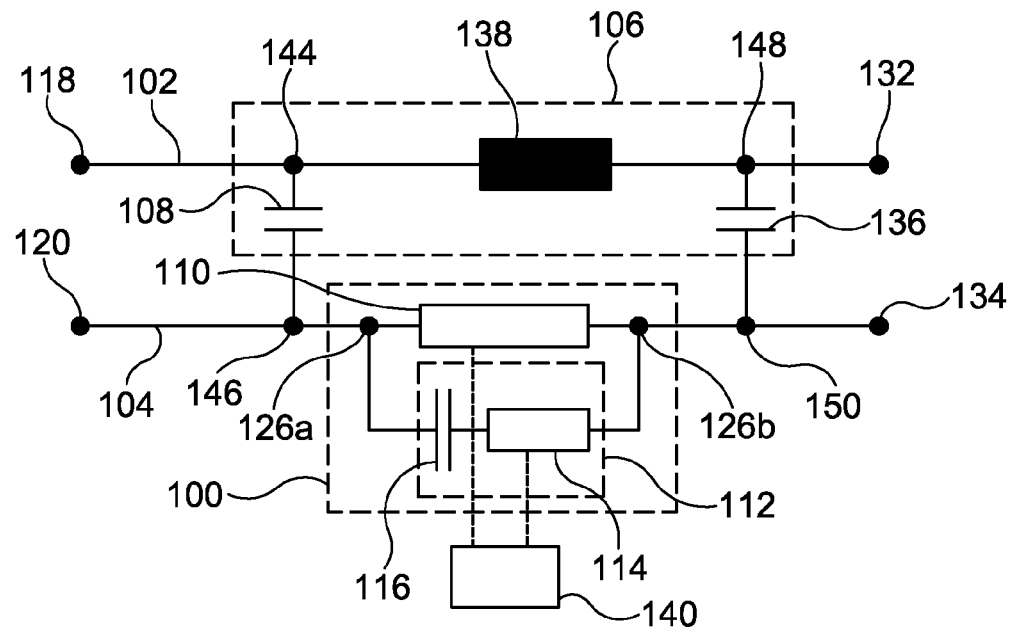
FIG. 6 is a schematic drawing of an alternative noise detection circuit utilising asymmetric power lines.

FIG. 6 shows a noise detection circuit with the impedance element 110 provided in series on the second power line, between the branch points 146, 150 of an asymmetric passive DM noise filter 106. The noise detection circuit 100 functions in a similar fashion to FIG. 1. However, unlike FIG. 1, this noise detection circuit also uses the asymmetry. The same reasoning applied to derive equations 2 and 3 can also be applied to the section of line between the second filter input 146 and the second filter output 150.

The effect of the asymmetry in this embodiment is to make the evaluation of the noise signal simpler and to improve the filtering of the DM noise, such that the DM noise has less impact on the measurement. Furthermore, in this embodiment, the noise sensing function can be combined with, for example, inrush current limiting means (not shown). The inrush current limiting means and the noise detection circuit 10 may share several common components.

For this embodiment, the filter capacitor 116 needs to be a high voltage one, as at the instant of switch-on of the apparatus, the full mains voltage can appear across the sensing resistor 110.

In FIG. 5, the noise sensor 100 in the capacitive branch has been realised in a similar manner to the noise filter 100 discussed in reference to FIG. 1. It will be appreciated that the structure discussed in relation to FIG. 2 may be provided on the capacitive branch instead. In such examples, the impedance element 110 is connected in series with the capacitor 108, and the filter inductor 142 is connected in parallel with the impedance element 108.

In FIG. 6, the noise sensor 100 in the capacitive branch has been realised in a similar manner to the noise filter 100 discussed in reference to FIG. 1. It will be appreciated that the structure discussed in relation to FIG. 2 may be provided instead.

An aim of the asymmetry is to isolate the CM noise signal, such that it can be reliably measured. As discussed above in relation to FIG. 4B, the asymmetry may be realised in any suitable manner. In general, the asymmetry is provided by any asymmetry element that causes the requisite conversion of the CM noise signal. The asymmetry element may be formed of a single or multiple components.

In the above examples, the asymmetry element comprises an inductor 138 provided on the first power supply line 102. The components of the asymmetry element could be provided at any position either side of the branch points 122, 124 connecting the CM noise detection circuit 100 to the power lines 102, 104. Part or all of the asymmetry element may also be provided before the input terminals 118, 120.

The net result of the asymmetry element, no matter how implemented, should be to force the CM noise current through the capacitor 108, causing the conversion necessary for detection of the CM noise signal.

The noise detection circuit 100 of any of the embodiments discussed above can form part of an active CM noise filter. The noise detection circuits 100 can be used for any suitable application.

The sensing resistor 110 may have any suitable resistance, depending on the desired application. The components of the filter 112 are also selected to give a filter 112 depending on the application. For example, a filter 112 that blocks or mitigates frequencies below an application dependent threshold, when the CM noise detection circuit 100 is provided in combination with a switched power supply, may be provided.

The resistance of the sensing resistor 110 should be chosen relative to the impedance of the DM filter capacitor 108, where asymmetrical lines 102, 104 are provided.

Where asymmetry is used in the noise detection circuit 100, the inductor 138 and capacitor 108 must be chosen such that the asymmetry is good enough. In one example good enough asymmetry may mean that the portion of the CM noise current travelling in the power line with the inductor 138 is as low as possible. In such examples, the inductor should be chosen such that none of the CM noise signal, or a negligible proportion of the CM noise signal, passes through the power line with the inductor 138. In other example, good enough may mean a different level of CM noise travelling in the power line with the inductor.

Furthermore, when a passive DM noise filter 106 is provided, the components are chosen to provide sufficient DM noise suppression according to common knowledge known in the art.

Any components used in the noise detection circuit 100, should also be chosen to minimise any impact on the power supply current.

FIGS. 1 to 3 and 5 to 6 show a resistor 110 and an evaluation circuit 140 to detect and process the CM noise signal. However, any suitable impedance element 110 and evaluation element 140 may be used.

The impedance element 110 may be a single component such as the resistor, or group or network of components. It will be appreciated that for noise detection, it is necessary that there is an impedance, not necessarily a physical resistor 110. In some examples, suitable impedances, such as a negative temperature coefficient resistor, could be used. This is especially advantageous when there has to be a kind of inrush current limitation. In that case the function of inrush current limiter and noise sensor impedance can be combined. In other examples, an integrated circuit can incorporate the impedance element 110 and/or the evaluation circuit 140 and can be used to detect and process the current or voltage passing through or dropping across the capacitor 108, and provide the output signal. The integrated circuit may comprise a current input or voltage input for connection to the second branch point 124, and a current output or a voltage output. The integrated circuit may provide information on the CM noise signal internally or as an output. As described in the previous embodiments, the CM noise signal can be sensed as a voltage across the filter resistor 114.

Figure 7:
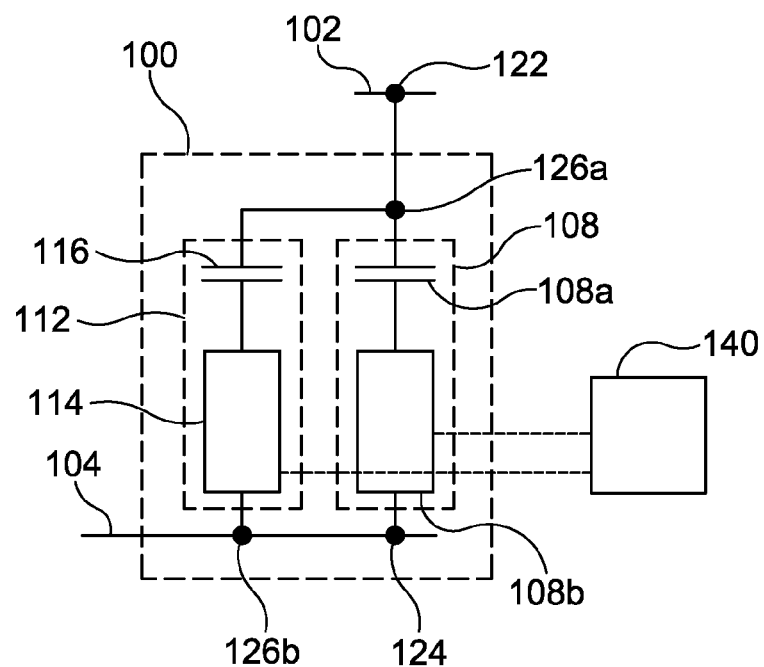
FIG. 7 is a schematic drawing of a CM noise detection circuit using the parasitic resistance of a capacitor as the impedance element.

In embodiments using asymmetry, the impedance element 110 may be a parasitic resistance 108b of the capacitive element 108. This is illustrated in FIG. 7. The embodiment shown in FIG. 7 is similar to the embodiment shown in FIG. 5. However, the arrangement of the capacitive branch is different. To illustrate this, FIG. 7 only shows the detail of the capacitive branch. Otherwise, it should be assumed that the embodiment of FIG. 7 is the same as the embodiment of FIG. 5.

In this embodiment, the capacitive branch running between the first 122 and second 124 branch points consists of the capacitor 108 only. The capacitor 108 is depicted as a series connection of the capacitance itself 108a and the parasitic resistance 108b.

All capacitors have a parasitic series resistance. The combined CM and DM noise, flowing through the capacitor 108 causes a voltage drop across the parasitic resistance 108b. This consists of two elements: the charging and discharging of the capacitance 108a itself, plus the voltage drop across parasitic resistance 108b. This voltage is sensed by the filter capacitor 116. To sense the voltage, the first filter branch point 126a is provided between the capacitor 108 and the first branch point 122.

The filter 112 suppresses the DM noise such that it can be considered negligible or zero in the voltage measured across the filter resistor 114. In some examples, the filter element 112 may not be a high-pass filter as discussed above, and may be a band-pass filter, that allows frequencies between an upper and lower limit to pass, instead. The lower end of the pass-band should be the same as the threshold of the high-pass filter discussed above.

The band-pass filter may be chosen to have a fixed pass-band or a variable pass-band. A variable pass-band may be achieved by using a variable high-pass filter (for example using a variable resistor) in combination with a variable low pass filter (not shown) or by other suitable integrated circuits.

The filter element 112, whether a high-pass filter of any order, band-pass filter of any order or other suitable filter of any order, can also be realised by an integrated circuit structure or other structures. In some examples part, or all, of the impedance element 110 and filter element 112 can be realised together by a combined integrated circuit or circuits.

In embodiments where the filtering is done in a digital form inside an integrated circuit, or where the detection circuit 100 is operated in conjunction with a DM noise filter 106, such that the DM noise signal in the lines 102, 104 has been sufficiently suppressed, the voltage across the impedance element 110 may be representative of the CM noise signal. In such examples, evaluation circuit 140 may be coupled to the impedance element 110 and the CM noise signal detected by measurement of the voltage across (or current through) the impedance element 110.

In examples where the filter element 112 and/or impedance element 110 are realised in integrated circuit(s), the integrated circuit(s) function in the same manner as their counterpart components and should be constructed in line with the same resistance and filtering requirements discussed above.

In embodiments utilising the parasitic resistance 108b of the capacitor 108, the filter capacitor 116 cannot be a small signal low voltage one, while in this embodiment the filter capacitor 116 has to withstand the (rectified or AC) mains input voltage.

In embodiments not having asymmetry, it will be appreciated that a noise detection circuit 100 may be provided in both of the power lines 102, 104. The separate noise detection circuits 100 may have separate evaluation circuits 140, or use a common evaluation circuit 140. The measurement of the CM noise signal by the two different noise detection circuits 100 may be compared to identify any problems with the lines 102, 104, and/or averaged.

It will be appreciated that the connections shown for the filter 112 are exemplary only, and any suitable arrangement of filter 112 may be used.

DM noise increases away from the power inputs 118, 120. Therefore, in the above embodiments, the detection circuit 100 is adjacent the first 118 and/or second 120 power input terminals. However, this is not essential, for example, the CM noise detection circuit 100 may be provided further from the power inputs and/or may be provided on the output or input side of the passive DM noise filter 106.

In the above embodiments, the CM noise detection circuit 100 is connected to a power supply (not shown) at the input terminals 118, 120. The supply may provide an alternating current (AC) or direct current (DC) supply.

In the case of an AC supply, the first and second power lines 118, 120 may be connected to the neutral and phase lines to measure the CM noise signal and provide a reference. In the case of a DC power supply, the first and second terminals 118, 120 may be connected to the positive and negative terminals of the supply. The first 102 and second 104 lines may both be the neutral or phase line or the positive or negative line. Furthermore, in the case of both AC and DC power supplies, there may be more than two lines 102, 104.

Figure 8:
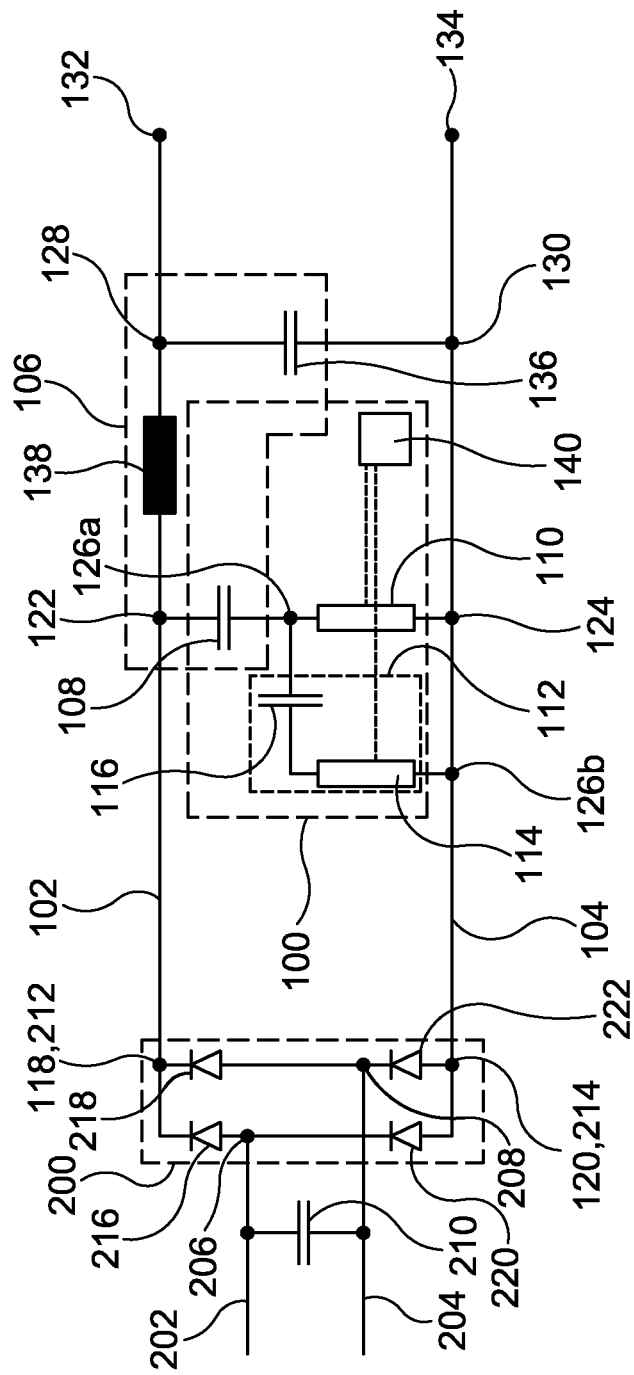
FIG. 8 is a schematic drawing of a CM noise detection circuit with an AC power input.

In the example of an AC power supply, the input terminals 118, 120 may be connected to the output terminals of any suitable AC to DC converter. FIG. 8 shows an example of the CM detection circuit/passive DM filter system shown in FIG. 5 with a bridge rectifier 200 provided at the inputs 118, 120. It will be appreciated that the bridge rectifier can be used with any of the embodiments discussed above.

The bridge rectifier 200 comprises a first input 206 and a second input 208, a first output 212 and a second output 214, and first 216, second 218, third 220 and fourth 222 diodes arranged between the inputs 206, 208 and the outputs 212, 214.

The bridge rectifier may also comprise the asymmetry element, when asymmetry is required in the noise detection circuit 100. For example, an asymmetric bridge rectifier may be used. This can be instead of, or as well as, part of the asymmetry element being provided elsewhere in the system, provided the overall system is still asymmetric such that the CM noise current is forced through the CM noise detection circuit 100.

The bridge rectifier 200 may be made asymmetric by providing capacitors 224, 226, 228, 230 (see FIG. 9) in parallel to each of the diodes 216, 218, 220, 222 of the bridge rectifier. The capacitors should be chosen to have different values such that the CM noise signal does not pass symmetrically through the bridge rectifier 200.

Where other AC to DC converters are used, the converter can still introduce asymmetry into the system by ensuring that the inductors of the converter are on one line 102, 104 only.

In some examples where a converter is used, a further capacitor is provided between the first and second input supply lines 202, 204 as an additional element of the passive DM noise filter. The noise detection circuit 100 may also be provided on the AC side of the converter.

Figure 9:
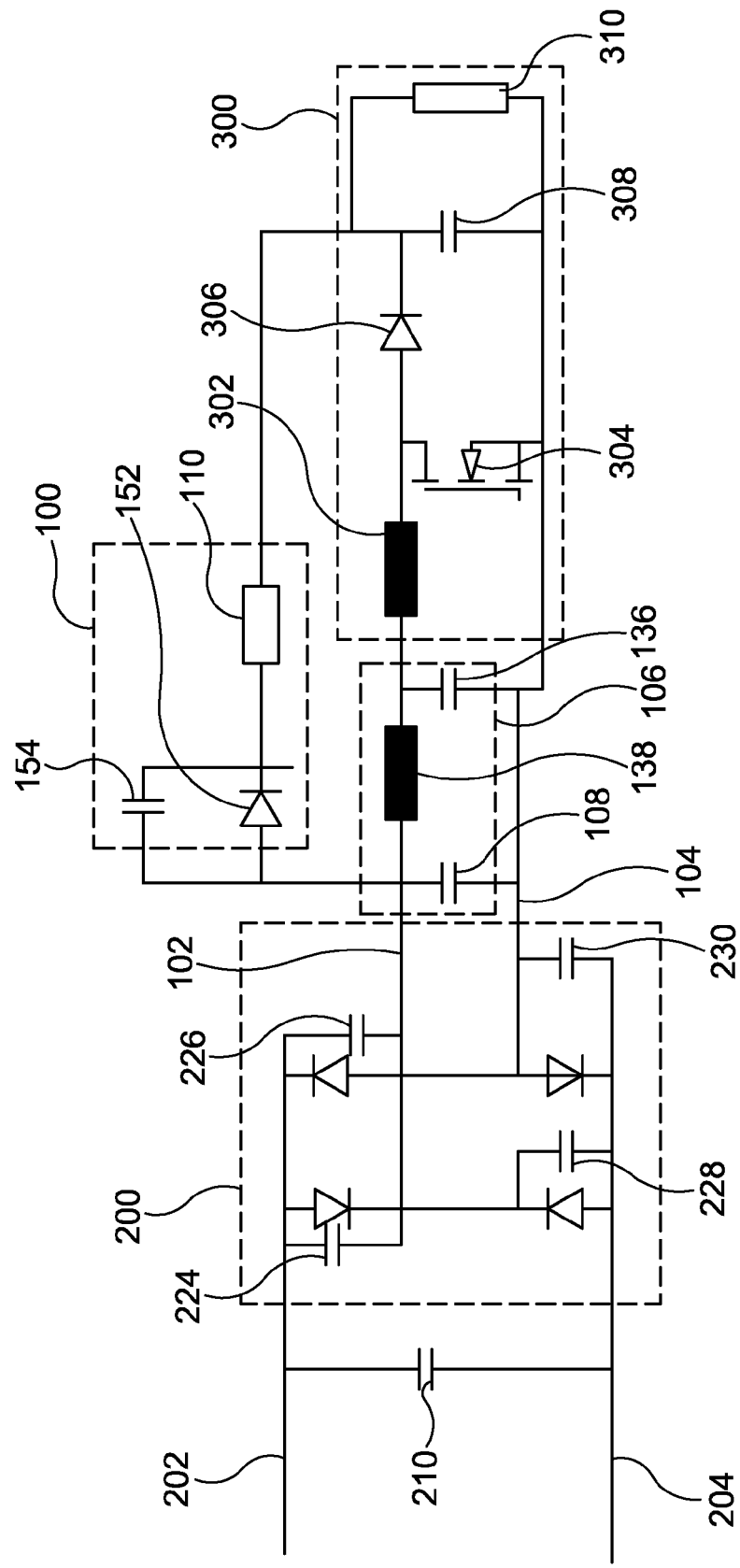
FIG. 9 is a schematic drawing of a further example of a CM noise detection circuit.

FIG. 9 illustrates a system which incorporates a bridge rectifier 200, a Pi filter 106 and inrush current bypass means that can also be used as a CM noise sensor 100. It will be appreciated that although these elements are shown in combination, this is not necessarily the case. Where components are the same as in previous embodiments, the same reference numerals are used.

In the embodiment illustrated in FIG. 9, capacitors 224, 226, 228 and 230 are provided across the diodes of the bridge rectifier. The bridge rectifier 200 may then made asymmetric by selecting the capacitors 224, 226, 228 and 230 to have different capacitances.

FIG. 9 also shows a load 300, which is represented by an inductor 302, an NMOS transistor 304, a diode 306 a capacitor 308 and a resistor 310. The resistor 310 itself is a power supply and a source of CM noise (the DM noise is zero or negligible).

In preconditioner applications, an additional diode 152 can be implemented between the first 102 (or second 104) power line and the load 300. The diode is implemented for management of surge currents, mains dips, inrush currents etc. . . . . The power supply current is not carried on the diode 152 line, because the voltage across the load capacitor 308 is higher than the voltage across the capacitor 108 on the capacitive branch in the passive DM noise filter 106.

However, the current management diode 152 forms a bypass for CM noise signals because of the capacitance of the diode 152. This bypass may be enhanced by a further capacitor 154 connected across the diode 152. When this is the case, the inductor 138 no longer causes asymmetry due to the bypass diode line.

In this embodiment, the DM noise does not pass through the diode line, and the diode line can be used to sense the CM noise signal. The impedance element 110 can be provided, in series with the diode 152, to sense the noise in the same manner as discussed above. Where the impedance element 110 is provided on the diode line, it needs to be selected to have small enough resistance that it does not limit the inrush current.

Since, in most practical applications, not much DM noise passes through the diode line, the diode 152 and capacitor 154 can be considered as suppressing DM noise in this line and therefore functioning as the filtering element 112.

In some embodiments, further filtering elements 112 may be provided across the impedance element, in the manner discussed in relation to FIGS. 1 to 8, to further improve the sensing of the CM noise signal.

Measurement in the time domain or frequency domain is possible. For example, when measuring in the time domain, the sensing may be time selective (e.g. evaluation only around the switching actions of a switch mode power supply or using time correlation functions). The already described high pass or band pass filtering is an example of measuring in the frequency domain.

Measurement in a combination of the time and frequency domain is also possible. This can be done by high pass or band pass filtering of the signal and integration of the obtained signal in the time domain over suitable time bases, for example 10 ms, 20 ms, or time selective portions within 10 ms or 20 ms as discussed above, during the switching period, or during time selective portions within the switching period.

To measure over the frequency domain and/or time domain, the signal is processed after its detection. This may be by the evaluation element 140 or a separate processor circuit.

The detection circuit may also be controlled such that it only measures the CM noise signal at certain times. For example, the CM noise signal may be measured periodically. In one example, the CM noise signal may be measured at a frequency of 100 Hz (i.e. one hundred measurements per second). In other examples, different frequencies may be used. In further examples, the CM noise signal may only be measured when the power supply is switching or during conduction or the blocking phase of the bridge rectifier.

The invention claimed is:

1. A noise detection circuit for a power supply, the noise detection circuit comprising:
   an impedance element connected to a line for carrying a power supply current having a noise signal component, the noise signal comprising a common mode noise signal and a differential mode noise signal;
   a filter element coupled to the impedance element and configured to suppress the differential mode noise signal in the noise detection circuit; and
   an evaluation circuit coupled to the impedance element or the filter element and arranged to sense the common mode noise signal and provide an output representative of the common mode noise signal.

2. The noise detection circuit as claimed in claim 1, wherein the evaluation circuit senses the common mode noise signal with respect to a reference, the reference being any suitable reference other than protective earth.

3. The noise detection circuit as claimed in claim 2, wherein the common mode noise signal is sensed with reference to a reference point selected from the list comprising: positive, negative, circuit ground, live wire and neutral wire.

4. The noise detection circuit of claim 1, wherein
the impedance element comprises a resistor, and
the evaluation element is a separate evaluation circuit coupled to the filter element,
the signal representative of the common mode noise signal being provided by measurement of the voltage across or current through the filter element.

5. The noise detection circuit of claim 1, wherein
the impedance element and/or evaluation circuit are comprised in an integrated circuit, and
the common mode noise signal is detected and processed by the integrated circuit,
the integrated circuit comprising a current input or voltage input and
the integrated circuit providing the signal representative of the common mode noise signal either internally or at an output.

6. The noise detection circuit of claim 1,
wherein the filter element comprises one or more of:
a high-pass filter coupled to the sensing element;
a band-pass filter coupled to the sensing element;
an inductance arranged as a filter; and
a digital filter realized by an integrated circuit.

7. The noise detection circuit of claim 1, comprising:
an alternating current power supply; and
a converter to convert the alternating current to a direct current.

8. The noise detection circuit of claim 1,
wherein the power supply comprises
a first power line extending between a first input terminal and a first output terminal, and
a second power line extending between a second input terminal and a second output terminal.

9. The noise detection circuit of claim 8, wherein the impedance element is provided adjacent the first input terminal and/or the second input terminal.

10. The noise detection circuit of claim 8, further comprising:
a capacitive element connectable between the first and second power lines of the power supply to form a capacitive conduction path therebetween; and
an asymmetry element connected to the capacitive conduction path and configured to cause a common mode noise signal in the power lines to pass through the capacitive conduction path.

11. The noise detection circuit of claim 10,
wherein the asymmetry element comprises an inductor arranged on either the first power supply line or the second power supply line.

12. The noise detection circuit of claim 10,
wherein the impedance element is connected in series with the capacitive element, such that the line for carrying a noise signal is provided by the capacitive conduction path.

13. The noise detection circuit as claimed in claim 8, wherein the impedance element is connectable in series between the first input terminal and the first output terminal or between the second input terminal and the second output terminal, the first or second power line providing the line carrying a noise signal.

14. The noise detection circuit of claim 8,
comprising a passive differential mode noise filter.

15. A noise detection circuit for a power supply, the noise detection circuit comprising:
an impedance element connected to a line for carrying a power supply current having a noise signal component, the noise signal comprising a common mode noise signal and a differential mode noise signal;
a filter element coupled to the impedance element and configured to suppress the differential mode noise signal in the noise detection circuit; and
an evaluation circuit coupled to the impedance element or the filter element and arranged to sense the common mode noise signal and provide an output representative of the common mode noise signal;
wherein the power supply comprises a first power line extending between a first input terminal and a first output terminal, and a second power line extending between a second input terminal and a second output terminal
wherein the impedance element is connectable in series between the first input terminal and the first output terminal or between the second input terminal and the second output terminal, the first or second power line providing the line carrying a noise signal; and
wherein a passive differential mode noise filter comprises a capacitive element and/or at least a portion of an asymmetry element.

16. A noise detection circuit for a power supply, the noise detection circuit comprising:
an impedance element connected to a line for carrying a power supply current having a noise signal component, the noise signal comprising a common mode noise signal and a differential mode noise signal;
a filter element coupled to the impedance element and configured to suppress the differential mode noise signal in the noise detection circuit;
an evaluation circuit coupled to the impedance element or the filter element and arranged to sense the common mode noise signal and provide an output representative of the common mode noise signal;
wherein the power supply comprises
a first power line extending between a first input terminal and a first output terminal, and
a second power line extending between a second input terminal and a second output terminal;
a capacitive element connectable between the first and second power lines of the power supply to form a capacitive conduction path therebetween; and
an asymmetry element connected to the capacitive conduction path and configured to cause a common mode noise signal in the power lines to pass through the capacitive conduction path.

17. A noise detection circuit for a power supply, the noise detection circuit comprising:
an impedance element connected to a line for carrying a power supply current having a noise signal component, the noise signal comprising a common mode noise signal and a differential mode noise signal;
a filter element coupled to the impedance element and configured to suppress the differential mode noise signal in the noise detection circuit;
an evaluation circuit coupled to the impedance element or the filter element and arranged to sense the common mode noise signal and provide an output representative of the common mode noise signal; and wherein the filter element comprises one or more of:
   a high-pass filter coupled to the sensing element;
   a band-pass filter coupled to the sensing element;
   an inductance arranged as a filter; and
   a digital filter realized by an integrated circuit.

\* \* \* \* \*